(12) United States Patent
Eckblad et al.

(10) Patent No.: US 6,407,922 B1
(45) Date of Patent: Jun. 18, 2002

(54) HEAT SPREADER, ELECTRONIC PACKAGE INCLUDING THE HEAT SPREADER, AND METHODS OF MANUFACTURING THE HEAT SPREADER

(75) Inventors: Michael Z. Eckblad, Auburn; Pardeep K. Bhatti, University Place, both of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,055

(22) Filed: Sep. 29, 2000

(51) Int. Cl.$^7$ ................................................. H05K 7/20
(52) U.S. Cl. .................. 361/704; 361/707; 361/709; 174/16.3; 165/185; 257/720
(58) Field of Search ............................ 361/704, 705, 361/706, 707, 708, 709; 257/706, 712; 165/80.2, 80.3, 185; 428/320.2, 614, 408, 634; 174/16.3, 252

(56) References Cited

U.S. PATENT DOCUMENTS

| | | | | |
|---|---|---|---|---|
| 5,316,080 A | * | 5/1994 | Banks et al. ................. | 165/185 |
| 5,520,976 A | * | 5/1996 | Giannetti et al. ........... | 428/36.3 |
| 5,958,572 A | * | 9/1999 | Schmidt et al. ........... | 428/320.2 |
| 5,965,267 A | * | 10/1999 | Nolan et al. ................. | 428/408 |
| 6,060,166 A | * | 5/2000 | Hoover et al. .............. | 361/704 |
| 6,075,701 A | * | 6/2000 | Ali et al. ..................... | 361/704 |
| 6,131,651 A | * | 10/2000 | Richey, III .................. | 165/185 |

FOREIGN PATENT DOCUMENTS

JP          352135678 A     * 11/1977    ........... H01L/23/36

* cited by examiner

Primary Examiner—Boris L. Chervinsky
(74) Attorney, Agent, or Firm—Antonelli, Terry, Stout & Kraus, LLP

(57) ABSTRACT

A heat spreader, method of making the heat spreader, and incorporation of the heat spreader in an assembly such as an electronic assembly, are disclosed. The heat spreader includes a matrix material, which has incorporated therein carbon nanotubes and/or thermal pyrolytic graphite flakes. The carbon nanotubes and/or thermal pyrolytic graphite flakes are situated between a first surface and a second surface of the heat spreader, to transfer heat from a heat source (e.g., an electronic component) adjacent the first surface to, e.g., a heat sink adjacent the second surface when the heat spreader is incorporated in the assembly. The first surface has a smaller surface area than that of the second surface. Desirably, the carbon nanotubes and/or thermal pyrolytic graphite flakes are aligned extending between the first and second surfaces, and spread out in a direction from the first surface to the second surface, to provide more effective heat transfer and uniform spreading of the heat. The matrix material can be a metal or plastic, and can be compliant, flexible and soft to provide better thermal contact of the heat spreader with the electronic component and heat sink, even if surfaces are uneven, and to provide protection for fragile electronic components against shock and vibration and during structural loading.

20 Claims, 2 Drawing Sheets

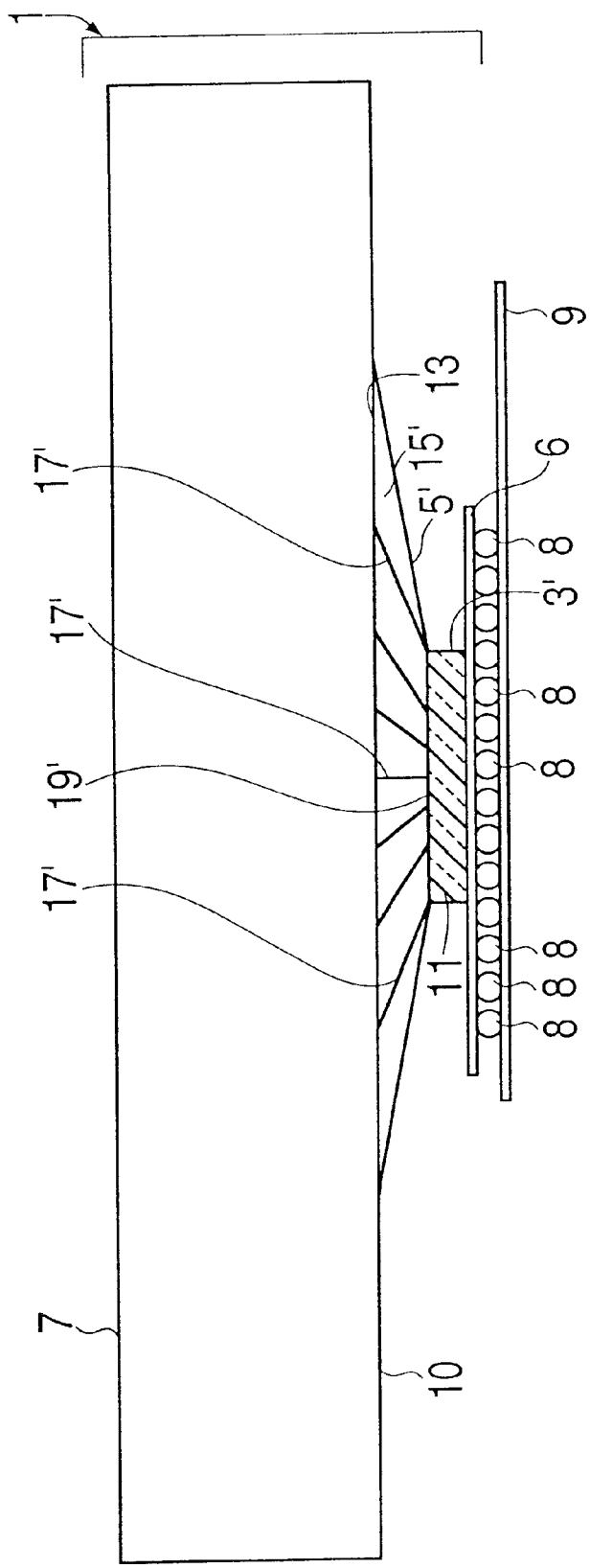

HEAT SPREADER, ELECTRONIC PACKAGE INCLUDING THE HEAT SPREADER, AND METHODS OF MANUFACTURING THE HEAT SPREADER

BACKGROUND

The present invention is directed to a heat spreader, which can be used for transferring heat away from a heat source, e.g., to a heat sink; to an assembly having the heat spreader in contact with the heat source, e.g., between the heat source and the heat sink; and to methods of manufacturing the heat spreader and the assembly.

The present invention is especially directed to such heat spreader, to an electronic assembly having such heat spreader, and methods of manufacturing such heat spreader and electronic assembly, wherein the electronic assembly includes an electronic component (for example, a semiconductor chip) which is a source of a high density or concentration of heat, and the electronic assembly includes the heat spreader between the electronic component and the heat sink (the heat spreader being in contact with a surface of the electronic component via, e.g., a thermally conductive adhesive, and also being in contact with a surface of the heat sink via, e.g., a thermally conductive adhesive).

Electronic components, such as semiconductor chips, are becoming smaller while heat dissipation requirements are increasing. Currently, in order to dissipate heat generated by these electronic components, heat spreaders are utilized between the electronic component and a heat sink; heat spreaders currently in use are made of a solid thermally conductive metal or are constituted by a heat pipe. However, these heat spreaders made of a solid thermally conductive metal or a heat pipe have various disadvantages. For example, the solid conductive metal has limited ability to spread heat, and has limited thermal conductivity characteristics. Heat pipes are expensive, large and have a fluid system (that is, are not completely solid) that can have reliability problems, including leakage problems. Moreover, solid heat spreaders and heat pipes currently in use are heavy.

BRIEF DESCRIPTION OF THE DRAWINGS

The foregoing and a better understanding of the present invention will become apparent from the following detailed description of example embodiments, and claims, when read in connection with the accompanying drawing figure, all forming a part of the disclosure of the present invention. While the foregoing and following written and illustrated disclosure focuses on disclosing example embodiments of the present invention, it should be clearly understood that the same is by way of illustration and example only and is not limited thereto. The spirit and scope of the present invention is limited only by the terms of the appended claims.

The following represents a brief description of the drawings, wherein:

FIG. 2 is a cross-sectional view schematically showing a mounted electronic assembly according to a further illustrative aspect of the present invention,

DETAILED DESCRIPTION

Figure 1:
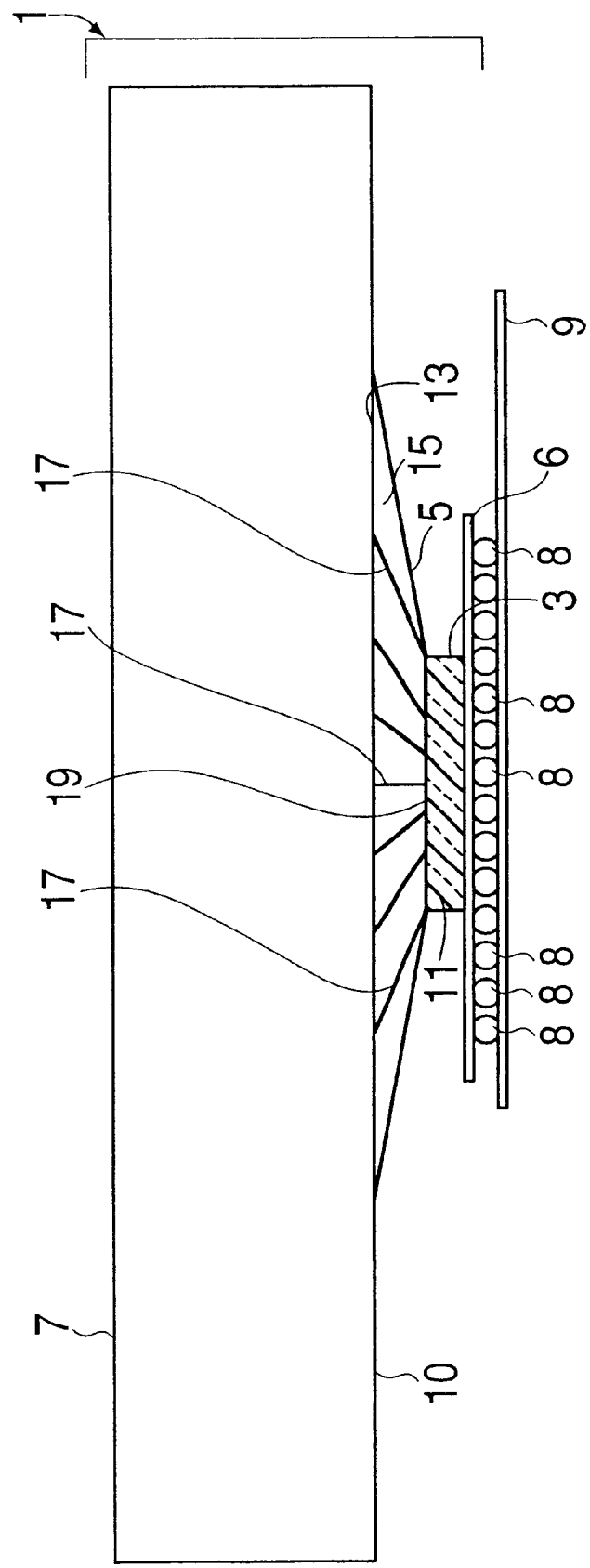
FIG. 1 is a cross-sectional view schematically showing a mounted electronic assembly according to an illustrative aspect of the present invention.

In the following, the description of illustrative and example embodiments of the present invention is in connection with an electronic assembly, including a semiconductor chip as an electronic component which is a source of a high density or concentration of heat, positioned on a printed circuit board. However, the present invention is not limited to an electronic assembly as shown in the sole drawing figure. Illustrative and example embodiments of the present invention include the heat spreader as an article of commerce by itself; and the heat spreader used in connection with transferring and spreading heat from various sources of a high density or high concentration of heat, to transfer heat away from the heat source and, e.g., uniformly spread the heat out over a larger surface of a heat sink; and various methods of forming the heat spreader and forming structure using the heat spreader.

That is, illustrative and example embodiments, and various aspects, of the present invention provide a heat spreader which can quickly transfer heat away from a source of a high density or concentration of heat to another location(for example, a heat sink), and uniformly spread the heat over a larger area. In further illustrative and example embodiments, and in various aspects, the heat spreader also can act as an isolator to protect fragile components during shock and vibration, and during structural loading. In addition, the heat spreader is solid (e.g., does not include a fluid system), has a relatively low thermal resistance (high thermal conductivity) and can achieve a uniform spread of heat from a small-area surface to a large-area surface. The heat spreader can be made of materials so that it is lightweight and can achieve maximum contact with the source of heat and the heat sink(if the heat spreader is in contact with a heat sink), even if the heat spreader, source of heat and/or heat sink has rough or uneven contacting surfaces.

By utilizing a heat spreader having carbon nanotubes and/or thermal pyrolytic graphite flakes incorporated in a matrix material, particularly where the carbon nanotubes or thermal pyrolytic graphite flakes are aligned from a first surface to be in contact with the source of a high density of heat to a second surface, heat can be quickly conducted away from the source of heat to the second surface. Moreover, by providing the heat spreader with a second surface having a greater surface area than that of the first surface, and spreading out the carbon nanotubes and/or thermal pyrolytic graphite flakes extending from the first surface toward the second surface, heat is spread over a surface(the second surface) having a larger area, and the heat can be uniformly spread over this larger area. The carbon nanotubes and thermal pyrolytic graphite flakes are highly thermally conductive and very effectively act to conduct heat very efficiently in one direction.

In addition, by using a heat spreader formed of a compliant(yieldable) or flexible matrix material having the carbon nanotubes and/or thermal pyrolytic graphite flakes incorporated therein, maximum thermal contact with the surface of the source of heat and with the surface of the heat sink can be achieved, even if the heat sink and/or heat source contacting the heat spreader, or even if the heat spreader itself, has-a surface that is uneven. Moreover, by utilizing a matrix material that is soft, the heat spreader can act as an isolator to protect fragile components during shock and vibration, and can protect the fragile components during structural loading. Through use of lightweight materials for the matrix material, the weight of the heat spreader can be decreased, so that overall weight of electronic packages including the heat spreader according to illustrative and example embodiments of the present invention, can be decreased.

Various matrix materials can be utilized for the heat spreader according to illustrative and example embodiments of the present invention. Illustratively and not to be limiting, the matrix materials can be a metal or plastic. Illustrative materials for the matrix material include, but are not limited to, aluminum and epoxy resins.

Incorporated in this matrix material of the heat spreader is at least one of carbon nanotubes and thermal pyrolytic graphite flakes, which act as heat conducting materials. These heat conducting materials, which provide improved thermal transfer and uniform heat spreading, are discussed in the following.

Carbon nanotubes are known materials, and are chains of carbon atoms in an extremely stable pattern. The carbon nanotubes, which can be stiffer than steel, need only be a nanometer wide but are many microns long, and are essentially rolled-up sheets of carbon hexagons. The carbon nanotubes have carbon atoms stacked on each other, and the carbon nanotubes have highly directional properties due to this stacking. The carbon nanotubes can be highly conductive of heat and electricity along the long axis of the nanotubes. The carbon nanotubes can be used to conduct heat in one direction (from the source of heat to, e.g., the heat sink) along the nanotubes.

Methods of producing bulk amounts of carbon nanotubes include carbon arc methods, known in the art. Illustratively, and not to be limiting, the carbon nanotubes can be provided with multiple concentric cylindrical shells of hexagonally bonded carbon atoms in the cathode deposit of a carbon arc generator run with a helium atmosphere of a few hundred Torr. A single wall carbon nanotube, having a wall comprising a single layer of carbon atoms, can be formed by contacting carbon vapor with cobalt, preferably the carbon vapor being produced by electric-arc heating, as described in U.S. Pat. No. 5,424,054. Thus, as can be seen in the foregoing, the carbon nanotubes can have a single cylindrical wall or multiple walls (cylinders inside other cylinders).

Desirably, the carbon nanotubes utilized according to aspects and various example embodiments of the present invention are used in the form of a bundle of the nanotubes, bundled, for example, as in a rope. That is, the nanotubes are of nanometer scale, but they are bundled together, e.g., twisted as in a rope, to form fiber material incorporated in the matrix material according to illustrative and example embodiments of the present invention.

While not to be limiting, illustratively single wall carbon nanotubes which can be used according to illustrative and example embodiments of the present invention have an average diameter of 1.2–1.4 nm, and a thermal conductivity on the order of 2,000 W/m/K. of course, these illustrative characteristics of single wall carbon nanotubes are merely illustrative, and are not to be limiting of the present invention.

The carbon nanotubes can be jumbled within the matrix material(illustratively and not to be limiting, jumbled fibers of the carbon nanotubes can be incorporated within the matrix material); however, preferably the carbon nanotubes are aligned(the direction that the carbon nanotubes extend is controlled), e.g., in the form of fibers, in a direction from a first surface of the heat spreader to a second surface of the heat spreader opposite the first surface (in a package containing the heat spreader, the first surface would contact the source of heat and the second surface would contact a heat sink, illustratively). Moreover, desirably these aligned carbon nanotubes spread out as they extend from the relatively small-surface-area first surface to the relatively large-surface-area second surface. By aligning the carbon nanotubes, and spreading the nanotubes out, heat conductance from the first to the second surface is more effective and efficient, to both transfer heat away from the source of heat and spread heat uniformly over a larger surface. The carbon nanotubes can be aligned in any known manner (for example, when the heat spreaders are formed by injection molding, the injection molding would naturally cause the nanotubes, e.g., fibers of the nanotubes, to align).

The carbon nanotubes can extend from (1) a first surface of the heat spreader, which is to be in contact with the source of heat when the heat spreader is incorporated in an assembly between the source of heat and the heat sink, to (2) a second surface to be in contact with the heat sink. While the carbon nanotubes can be exposed at at least one of the first and second surfaces, the nanotubes need not be exposed, and would still achieve desirable heat transfer and spreading of the heat.

The carbon nanotubes can be incorporated in the matrix material at a fairly low volume. For example, and not to be limiting, the heat spreader can include between about 20% and 60% by volume carbon nanotubes (for example, fibers of the nanotubes, desirably bundled like in a rope), relative to the volume of the matrix material.

As another aspect and illustrative embodiment of the present invention, material providing heat transport through the heat spreader, from the source of heat to the heat sink, can be thermal pyrolytic graphite flakes. Preferably, these flakes are aligned, to control the direction that the length of the flakes extend, positioned to effectively and efficiently transport heat from the first surface in contact with the source of heat when the heat spreader is assembled into an assembly (between the heat source and heat sink), to a second surface(e.g., opposite the first surface) in contact with the heat sink.

The flakes can be aligned by any known technique. One illustrative technique is to provide the heat spreader by injection molding the matrix material into an injection mold containing the flakes; such injection molding causes the flakes to align, e.g., in the direction that the matrix material is injected. For example, the matrix material can be a plastic, and the heat spreader can be formed by injection molding of the plastic into an injection mold containing the flakes, causing desired alignment of the flakes.

As discussed previously in connection with the carbon nanotubes, desirably the heat spreader has a first surface(to be in contact with the source of heat) with a relatively small surface area and a second surface(to be in contact with a heat sink) with a relatively large surface area as compared to the surface area of the first surface. Alignment of the thermal pyrolytic graphite flakes in this heat spreader having first and second surfaces with the different surface areas would be conducted to spread out the flakes extending from the first surface to the second surface, so that the heat transferred from the heat source can be uniformly spread over the entire surface area of the second surface.

These flakes are known materials, used, for example, in linings in nuclear reactors. Illustratively, and not to be limiting, a thermal pyrolytic graphite material which can be utilized to effectuate heat transfer and spreading within the matrix material, according to illustrative and example embodiments of the present invention, is a material designated as "TC1050", from Advanced Ceramics Corp. (11907 Madison Avenue,. Cleveland, Ohio 44107).

While not to be limiting, the thermal pyrolytic graphite material can be loaded in the heat spreader in an amount, for example, of about 50% by volume, of the total volume of the heat spreader.

As indicated previously, the flakes extend from a first surface to, e.g., a second, opposed surface of the heat spreader. The flakes can be exposed on the surface of the heat spreader, but do not need to be exposed, in order to provide the heat transfer and heat spreading as discussed previously.

Generally, the heat spreader according to the present invention can be made by various molding techniques. For example, the carbon nanotubes or thermal pyrolytic graphite flakes can be loaded into a mold, and the matrix material cast around and through the mass of nanotubes/flakes in the mold. Illustratively, and not to be limiting, a mass of nanotubes (e.g., in the form of a jumbled mass of the nanotubes or a jumbled mass of bundles of the nanotubes) can be provided in a mold, with the matrix material then cast around and through the mass.

Another technique, which provides preferred alignment of the nanotubes/flakes, is an injection molding procedure. In this procedure, initially the nanotubes and/or flakes are provided in an injection mold. Thereafter, the matrix material is injected into the mold. For example, where the matrix material is a plastic, the plastic can be injected into the mold, as a molten material, as known in the art. Flow of the injection molded plastic into the mold naturally causes an alignment of the nanotubes and/or flakes in the mold, and the nanotubes and/or flakes maintain alignment in the matrix material after solidification thereof.

The mold should desirably have structure wherein a first surface of the mold has a relatively small surface area and an opposed surface of the mold has a relatively large surface area, with the nanotubes/flakes being preferably aligned in the mold extending from the first surface of relatively small area to the second surface of relatively large area. With the nanotubes/flakes aligned to extend from the first surface toward the second surface, and spread out across the entire surface area of the first surface and across the entire surface area of the second surface, heat is most efficiently and effectively transported, and spreading of the heat over the larger area is most effectively and efficiently achieved.

The heat spreader according to illustrative and example embodiments of the present invention is substituted for currently used solid conductive metal heat spreaders and heat pipe heat spreaders. The heat spreaders according to illustrative and example embodiments of the present invention can be adhered to the heat sink and thermal source by known techniques; for example, a thermally conductive adhesive can be utilized. Desirably, the surface area of the first surface of the heat spreader is approximately the same size as the surface of the source of heat to which the heat spreader contacts, and covers this surface of the source of heat, to maximize efficiency of transfer of heat from the source of heat. The second surface of the heat spreader, adjacent the heat sink in the assembly of heat source, heat spreader and heat sink, need not be of the same size as the heat sink to which the heat spreader is in contact, but can be.

FIG. 1 shows an illustrative and exemplary embodiment of the present invention, for explanation purposes, and is not limiting of the present invention. Shown in this figure is electronic assembly 1, which includes semiconductor chip 3, heat spreader 5 and heat sink 7. Semiconductor chip 3, during operation, generates a large amount of heat per unit area. Semiconductor chip 3 can be, for example, flip-chip bonded to pads on flip-chip substrate 6, as conventional in the art. Flip-chip substrate 6 is bonded, via solder balls 8, to printed circuit board 9. For example, and not to be limiting, solder balls 8 connect pads on flip-chip substrate 6 to pads on printed circuit board 9. Printed circuit board 9 can illustratively include a thin film circuit on a multilayer ceramic board. Surface 19 of semiconductor chip 3 is in contact with first surface 11 of heat spreader 5. Second surface 13 of heat spreader 5 is in contact with an adjacent surface 10 of heat sink 7.

While, in the foregoing, solder balls 8 are described for connecting flip-chip substrate 6 to printed circuit board 9, the present invention is not limited to this connection technique. For example, a column grid array can be used for the connection between flip-chip substrate 6 and printed circuit board 9. In general, known surface mount techniques can be used for this connecting.

Heat spreader 5 includes matrix material 15, and carbon nanotubes and/or thermal pyrolytic graphite flakes, shown schematically as aligned, and denoted by reference character 17. As seen in this figure, the carbon nanotubes and/or thermal pyrolytic graphite flakes spread out as they extend from first surface 11 to second surface 13 of heat spreader 5. As can be appreciated from this figure, heat generated in semiconductor chip 3 during operation of the chip is transferred to heat spreader 5 through first surface 11 of heat spreader 5, and is efficiently and effectively transported away from semiconductor chip 3 through heat spreader 5 to heat sink 7.

Furthermore, the heat spreads uniformly from the relatively small surface area of surface 11 to the relatively large surface area of surface 13, of heat spreader 5, as the heat passes through the thickness of heat spreader 5. That is, due to the effective and efficient heat transfer by the carbon nanotubes and/or thermal pyrolytic graphite flake material represented by reference character 17 in the figure, particularly where the nanotubes and/or flakes are aligned as shown in the figure, heat can be effectively and efficiently spread out over a larger area from the first surface of a relatively small area to a second surface of a relatively large area, to not only transport the heat away from semiconductor chip 3 but also spread the heat over a larger area for more effective use of heat sink 7.

Moreover, according to illustrative and example embodiments of the present invention, the matrix material is a compliant material. Through use of a compliant (yielding) matrix material, thermal contact between heat spreader 5 and semiconductor chip 3 between heat spreader 5 and heat sink 7 can be improved, even where any of the various surfaces (e.g., surface 19 of semiconductor chip 3, surfaces 11 and 13 of heat spreader 5, and/or surface 10 of heat sink 7) are uneven. For example, even where surface 19 of semiconductor chip 3, contacting first surface 11 of heat spreader 5, is uneven, through use of the compliant matrix material heat spreader 5 can more effectively contact the uneven surface (contact more surface area of the uneven surface), so as to improve heat transfer.

FIG. 2 shows another embodiment of the present invention. In FIG. 2, structures corresponding to that in FIG. 1 are designated by the same reference characters. FIG. 2 schematically shows structure wherein surface 19' of semiconductor chip 3' is uneven; where matrix material 15' is a compliant matrix material, heat spreader 5' can more effectively contact uneven surface 19' of semiconductor chip 3'. FIG. 2 also schematically shows bundled carbon nanotubes 17.

Many different embodiments of the present invention may be constructed without departing from the spirit and scope of the invention. For example, while illustrative and example embodiments of the present invention have been described in connection with a semiconductor chip as the source of heat, various other electrical components generating heat can be utilized as the thermal source. More generally, various illustrative and example embodiments of the present invention include thermal sources other than an electrical component which generates heat (for example, components generating heat by means other than electrical means, or even a component which retains heat from another source). Moreover, various different heat sinks can be used, and, e.g., the second surface of the heat spreader can be exposed to air (e.g., air acts as a "heat sink") where appropriate. As can be appreciated, the heat spreader transfers heat from the heat source to another location, and where appropriate need not be in contact with a heat sink.

It should be understood that the present invention is not limited to the specific embodiments described in this specification. To the contrary, the present invention is intended to cover various modifications and equivalent arrangements included within the spirit and scope of the claims.

What is claimed is:

1. A heat spreader, comprising:
   a matrix material; and
   at least one of carbon nanotubes and thermal pyrolytic graphite flakes distributed through the matrix material, wherein the heat spreader has a first surface adapted to be in contact with a source of heat a second surface opposed to the first surface wherein the second surface has a larger surface area than that of the first surface, and wherein said at least one of carbon nonotubes and thermal pyrolytic graphite flakes is distributed and oriented from the first surface to the second surface through the matrix material, such that the at lest one of carbon nanotube and thermal pyrolytic graphite flakes spreads out extending from the first surface to the second surface, so that the heat spreader is adapted to conduct heat from said first surface to said second surface, and spread out the heat conducted from the first surface to the second surface, as the heat is conducted from the first surface to the second surface, so as to spread the heat over a larger area at the second surface than at the first surface when the source of heat is in contact with the first surface.

2. The heat spreader according to claim 1, wherein the carbon nanotubes are distributed through the matrix material.

3. The heat spreader according to claim 2, wherein the carbon nanotubes are in the form of groups of bundled nanotubes.

4. The heat spreader according to claim 2, wherein the carbon nanotubes are aligned and spread out extending in a direction from the first surface to the second surface.

5. The heat spreader according to claim 2, wherein the carbon nanotubes are included in the matrix material in an amount between about 20% and 60% by volume of the carbon nanotubes to the volume of the matrix material.

6. The heat spreader according to claim 1, wherein the thermal pyrolytic graphite flakes are distributed through the matrix material, and wherein the flakes are aligned and spread out so that the heat spreader is adapted to conduct heat from said first surface to said second surface, and spread out the heat conducted from the first surface to the second surface, when the source of heat is in the contact with the first surface.

7. The heat spreader according to claim 1, wherein the matrix material is a plastic material.

8. The heat spreader according to claim 7, wherein the plastic material is an epoxy resin.

9. The heat spreader according to claim 1, wherein the matrix material is a metal.

10. The heat spreader according to claim 9, wherein the metal is aluminum.

11. Structure comprising:
    a heat spreader, and
    a member which is a source of heat and which is in contact with a first surface of the heat spreader, the heat spreader having a second surface opposed to the first surface, wherein the second surface has a larger surface area than that of the first surface,
    wherein the heat spreader includes a matrix material and at least one of carbon nanotubes and thermal pyrolytic graphite flakes distributed through the matrix material, and
    wherein said at least one of carbon nanotubes and thermal pyrolytic graphite flakes is distributed and oriented from the first surface to the second surface through the matrix material, such that the at least one of carbon nanotubes and thermal pyrolytic graphite flakes spreads out extending from the first surface to the second surface, so that the heat spreader is adapted to conduct heat from said first surface to said second surface, and spread out the heat conducted from the first surface to the second surface, as the heat is conducted from the first surface to the second surface, so as to spread the heat over a larger area at the second surface than at the first surface when the source of heat is in contact with the first surface.

12. Structure according to claim 11, wherein said member is an electronic component, the structure being an electronic assembly.

13. Electronic assembly according to claim 12, wherein the electronic component is a semiconductor chip.

14. Electronic assembly according to claim 12, wherein the carbon nanotubes are distributed through the matrix material.

15. Electronic assembly according to claim 12, wherein the surface area of the first surface is substantially the same as the surface area of the surface of the electronic component contacted by the heat spreader, and the first surface substantially covers said surface of the electronic component contacted by the heat spreader.

16. Electronic assembly according to claim 12, further comprising a heat sink, in contact with the second surface of the heat spreader.

17. Electronic assembly according to claim 16, wherein the matrix material is a sufficiently compliant material so as to substantially conform to surfaces of the electronic component and of the heat sink that the heat spreader contacts.

18. Electronic assembly according to claim 12, wherein said matrix material is a material selected from the group consisting of plastics and metals.

19. Electronic assembly according to claim 12, wherein the electronic component has an uneven surface contacted by the heat spreader, and wherein the matrix material of the heat spreader is sufficiently compliant so as to conform to said uneven surface of the electronic component.

20. Electronic assembly according to claim 12, wherein the thermal pyrolytic graphite flakes are distributed through the matrix material, and the thermal pyrolytic graphite flakes are aligned and spread out so that the heat spreader is adapted to conduct heat from said first surface to said second surface when the source of heat is in contact with the first surface, so as to spread out the heat over the larger area.

* * * * *